United States Patent
Tabatabaei et al.

(10) Patent No.: US 11,196,480 B2
(45) Date of Patent: Dec. 7, 2021

(54) HIGH LINEARITY SATELLITE PAYLOAD USING SOLID STATE POWER AMPLIFIERS

(71) Applicant: Maxar Space LLC, Palo Alto, CA (US)

(72) Inventors: Seyed Tabatabaei, Mountain View, CA (US); Jim Sowers, Sunnyvale, CA (US); Ghislain Turgeon, San Jose, CA (US)

(73) Assignee: Maxar Space LLC, Palo Alto, CA (US)

( * ) Notice: Subject to any disclaimer, the term of this patent is extended or adjusted under 35 U.S.C. 154(b) by 0 days.

(21) Appl. No.: 16/683,520

(22) Filed: Nov. 14, 2019

(65) Prior Publication Data

US 2020/0091996 A1  Mar. 19, 2020

Related U.S. Application Data

(62) Division of application No. 16/113,567, filed on Aug. 27, 2018, now Pat. No. 10,511,377.

(51) Int. Cl.
| | |
|---|---|
| *H04B 7/185* | (2006.01) |
| *H04B 1/04* | (2006.01) |
| *H04B 1/18* | (2006.01) |
| *H03F 1/02* | (2006.01) |
| *H03F 3/24* | (2006.01) |

(Continued)

(52) U.S. Cl.
CPC ......... *H04B 7/18515* (2013.01); *H01Q 1/288* (2013.01); *H03F 1/0288* (2013.01);
(Continued)

(58) Field of Classification Search
CPC ...... H03F 3/24; H03F 2200/78; H03F 1/0205; H03F 1/0222; H03F 1/0277;
(Continued)

(56) References Cited

U.S. PATENT DOCUMENTS

| | | | |
|---|---|---|---|
| 5,119,042 A * | 6/1992 | Crampton | H03F 1/0216 330/136 |
| 6,864,742 B2 * | 3/2005 | Kobayashi | H03F 1/3241 330/124 R |

(Continued)

FOREIGN PATENT DOCUMENTS

WO   WO2015/176077 A2   11/2015

OTHER PUBLICATIONS

Response to European Search Report dated Sep. 1, 2020, European Patent Application No. 19192648.4.
(Continued)

*Primary Examiner* — Shaima Q Aminzay
(74) *Attorney, Agent, or Firm* — Vierra Magen Marcus LLP

(57) ABSTRACT

A solid state power amplifier uses a Doherty power amplifier that can be implemented as a monolithic microwave integrated circuit. By adjusting the DC bias of the amplifying stages in each branch of the Doherty amplifier, the output power, linearity, and DC power can be adjusted to provide a specified output, where the specification for the output can include the maintaining of desired DC power and linearity. The Doherty power amplifier can be used in a satellite payload or other application utilizing solid state power amplifiers, while providing the proper amount of RF output power and DC power. A single amplifier can have its bias levels adjusted for different output levels, helping to minimize the number of designs that are required for a given satellite payload, reducing the variety of parts in a satellite payload.

13 Claims, 14 Drawing Sheets

(51) Int. Cl.
*H03F 3/195* (2006.01)
*H01Q 1/28* (2006.01)

(52) U.S. Cl.
CPC ............ *H03F 3/195* (2013.01); *H03F 3/245* (2013.01); *H04B 1/04* (2013.01); *H04B 1/0458* (2013.01); *H04B 1/0483* (2013.01); *H04B 1/18* (2013.01); *H03F 2200/451* (2013.01); *H04B 2001/045* (2013.01)

(58) Field of Classification Search
CPC .. H03F 1/0288; H03F 1/3282; H03F 3/45941; H04B 10/695; H04B 1/109; H04B 1/005
USPC ........................................................ 455/13.3
See application file for complete search history.

(56) References Cited

U.S. PATENT DOCUMENTS

| | | |
|---|---|---|
| 8,237,504 B1 | 8/2012 | Moochalla et al. |
| 2004/0174212 A1 | 9/2004 | Kim et al. |
| 2011/0248784 A1 | 10/2011 | Grondahl |
| 2013/0120061 A1 | 5/2013 | van der Zanden et al. |
| 2017/0040953 A1* | 2/2017 | Beltran Lizarraga ... H03F 3/211 |

OTHER PUBLICATIONS

U.S. Appl. No. 16/113,567, filed Aug. 27, 2018.

Notice of Allowance dated Aug. 14, 2019, U.S. Appl. No. 16/113,567, filed Aug. 27, 2018.

Extended European Search Report dated Jan. 21, 2020, European Patent Application No. 19192648.4.

Office Action dated Oct. 2, 2020, European Patent Application No. 19192648.4.

Response to Office Action dated Apr. 9, 2021, European Patent Application No. 19192648.4.

Office Action dated Oct. 22, 2021, European Patent Application No. 19192648.4.

* cited by examiner

HIGH LINEARITY SATELLITE PAYLOAD USING SOLID STATE POWER AMPLIFIERS

CLAIM OF PRIORITY

This application is a divisional application of U.S. patent application Ser. No. 16/113,567, entitled "HIGH LINEARITY SATELLITE PAYLOAD USING SOLID STATE POWER AMPLIFIERS," filed Aug. 27, 2018 and issued as U.S. Pat. No. 10,511,377 on Dec. 17, 2019, and incorporated herein by reference in its entirety.

BACKGROUND

In order to accurately transmit signals to subscribers, a communication satellite needs to amplify its output signals with a high degree of linearity, while providing the proper amount of Radio Frequency (RF) output power and Direct Current (DC) power. As these output signals are often required for a number of different output levels, being able to provide these signals with the needed degree of linearity can result in a satellite payload having a large number of amplifier designs, increasing weight and complexity.

DETAILED DESCRIPTION

The following presents techniques for controlling the Radio Frequency (RF) output power level, Direct Current (DC) power, and linearity of Solid State Power Amplifier (SSPA) devices through biasing. More specifically, the solid state power amplifier uses a Doherty Power Amplifier (PA) that can be implemented as a Monolithic Microwave Integrated Circuit (MMIC), where setting/adjusting the bias on different arms of the Doherty power amplifier is used to affect the output power (Pout), DC power (Pdc) and linearity of the amplifier's output. The embodiments presented here are discussed mainly in the context of a satellite implementation, where these bias parameters can be set to achieve a specific goal for a flight set or adjusted in-orbit to adapt to different operating scenarios as needed.

The following presents embodiments for solid state power amplifiers using a single Doherty power amplifier or a combination of multiple Doherty power amplifiers that contains DC bias circuitry. The Doherty amplifier can be implemented as a single MMIC in a variety of semiconductor processes or in a hybrid format using a combination of thin films and semiconductor devices. Doherty amplifier includes a main branch connected in parallel with an auxiliary branch, where each branch of the Doherty amplifier has the same number of stages, which can be one, two or more stages of amplification. The auxiliary, or peaking, branch contributes to the output only when the input signal exceeds some threshold value. Each stage in the main and auxiliary branches of the Doherty amplifier has its own DC bias feeds. By adjusting the DC bias of the amplifying stages in each branch of the Doherty amplifier, the output power, linearity, and DC power can be adjusted to provide a specified output, where the specifications for the output can include the maintaining of desired DC power (Pdc) and linearity while adjusting the output power level in back-off.

The arrangements presented here provide for high linearity in a satellite payload or other application utilizing SSPAs, while providing the proper amount of RF output power (Pout) and DC power (Pdc). As a single amplifier can have its biase levels adjusted for different output levels, this can help to minimize the number of designs that are required for a given satellite payload, reducing the variety of parts in a satellite payload by leveraging the same MIMIC at different output power settings. Through proper biasing of the PA's MIMIC, the linearity, Pout, Pdc trade in a payload can be optimized, supporting an SSPA with a range of output power levels and also able to support a variety of antenna configurations including Single Element per Beam architectures through Direct Radiating Multi-Element per Beam architectures.

Figure 1:
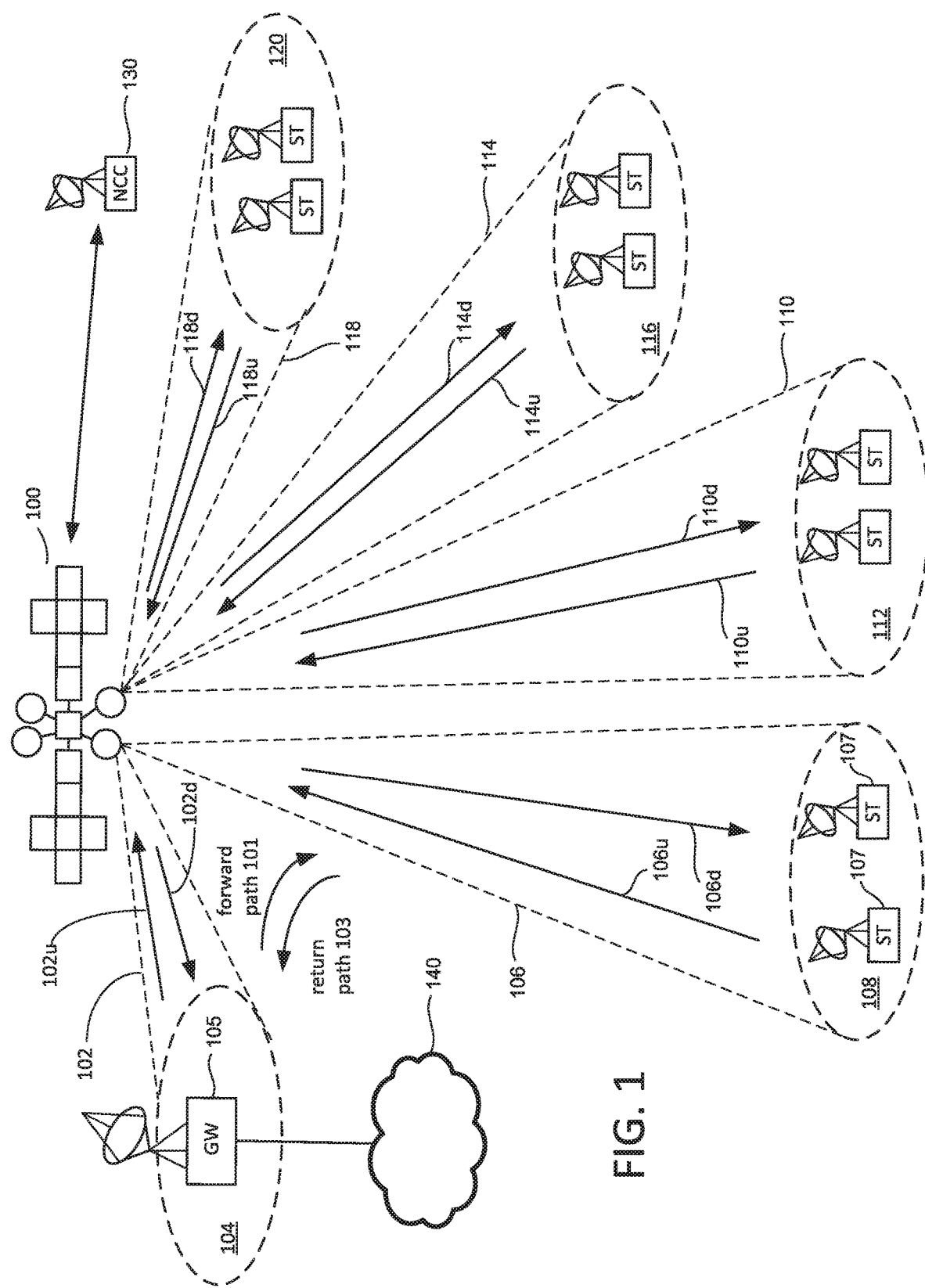
FIG. 1 is a block diagram describing a satellite communication system.

FIG. 1 illustrate one embodiment in which these methods can be applied and depicts a block diagram of a wireless communications system that includes a communication platform 100, which may be a satellite located, for example, at a geostationary or non-geostationary orbital location. In other embodiments, other platforms may be used such as UAV or balloon, or even a ship for submerged subscribers. In yet another embodiment, the subscribers may be air vehicles and the platform may be a ship or a truck where the "uplink" and "downlink" in the following paragraphs are reversed in geometric relations. Platform 100 may be communicatively coupled to at least one gateway 105 and a plurality of subscriber terminals ST (including subscriber terminals 107). The term subscriber terminals may be used to refer to a single subscriber terminal or multiple subscriber terminals. A subscriber terminal is adapted for communication with the wireless communication platform including as satellite 100. Subscriber terminals may include fixed and mobile subscriber terminals including, but not limited to, a cellular telephone, wireless handset, a wireless modem, a data transceiver, a paging or position determination receiver, or mobile radio-telephone, or a headend of an isolated local network. A subscriber terminal may be hand-held, portable (including vehicle-mounted installations for cars, trucks, boats, trains, planes, etc.) or fixed as desired. A subscriber terminal may be referred to as a wireless communication device, a mobile station, a mobile wireless unit, a user, a subscriber, or a mobile.

In one embodiment, satellite 100 comprises a bus (i.e. spacecraft) and one or more payloads (i.e. the communication payload). The satellite may also include multiple power sources, such as batteries, solar panels, and one or more propulsion systems, for operating the bus and the payload.

At least one gateway 105 may be coupled to a network 140 such as, for example, the Internet, terrestrial public switched telephone network, mobile telephone network, or a private server network, etc. Gateway 105 and the satellite (or platform) 100 communicate over a feeder beam 102, which has both a feeder uplink 102*u* and a feeder downlink 102*d*. In one embodiment, feeder beam 102 is a spot beam to illuminate a region 104 on the Earth's surface (or another surface). Gateway 105 is located in region 104 and communicates with satellite 100 via feeder beam 102. Although a single gateway is shown, some implementations will include many gateways, such as five, ten, or more. One embodiment includes only one gateway. Each gateway may utilize its own feeder beam, although more than one gateway can be positioned within a feeder beam. Note that the terms "feeder" beams and "service" beams are used for convenience. Both feeder beams and service beams are spot beams and the terms are not used in a manner to limit the function of any beam. In one embodiment, a gateway is located in the same spot beam as sub scriber terminals.

Subscriber terminals ST and satellite 100 communicate over service beams; for example, FIG. 1 shows service beams 106, 110, 114 and 118 for illuminating regions 108, 112, 116 and 120, respectively. In many embodiments, the communication system will include more than four service beams (e.g., 60, 100, etc.). Each of the service beams have an uplink (106*u*, 110*u*, 114*u*, 118*u*) and a downlink (106*d*, 110*d*, 114*d*, 118*d*) for communication between subscriber terminals ST and satellite 100. Although FIG. 1 only shows two subscriber terminals within each region 108, 112, 116 and 120, a typical system may have thousands of subscriber terminals within each region.

In one embodiment, communication within the system of FIG. 1 follows a nominal roundtrip direction whereby data is received by gateway 105 from network 140 (e.g., the Internet) and transmitted over the forward path 101 to a set of subscriber terminals ST. In one example, communication over the forward path 101 comprises transmitting the data from gateway 105 to satellite 100 via uplink 102*u* of feeder beam 102, through a first signal path on satellite 100, and from satellite 100 to one or more subscriber terminals ST via downlink 106*d* of service beam 106. Although the above example mentions service beam 106, the example could have used other service beams.

Data can also be sent from the subscriber terminals ST over the return path 103 to gateway 105. In one example, communication over the return path comprises transmitting the data from a subscriber terminal (e.g., subscriber terminal 107 in service beam 106) to satellite 100 via uplink 106*u* of service beam 106, through a second signal path on satellite 100, and from satellite 100 to gateway 105 via downlink 102*d* of feeder beam 102. Although the above example uses service beam 106, the example could have used any service beam.

FIG. 1 also shows a Network Control Center 130, which includes an antenna and modem for communicating with satellite 100, as well as one or more processors and data storage units. Network Control Center 130 provides commands to control and operate satellite 100. Network Control Center 130 may also provide commands to any of the gateways and/or subscriber terminals.

In one embodiment, communication platform 100 implements the technology described above. In other embodiments, the technology described above is implemented on a different platform (e.g. on the ground or on a different type of satellite) in a different communication system.

The architecture of FIG. 1 is provided by way of example and not limitation. Embodiments of the disclosed technology may be practiced using numerous alternative implementations.

Figure 2A:
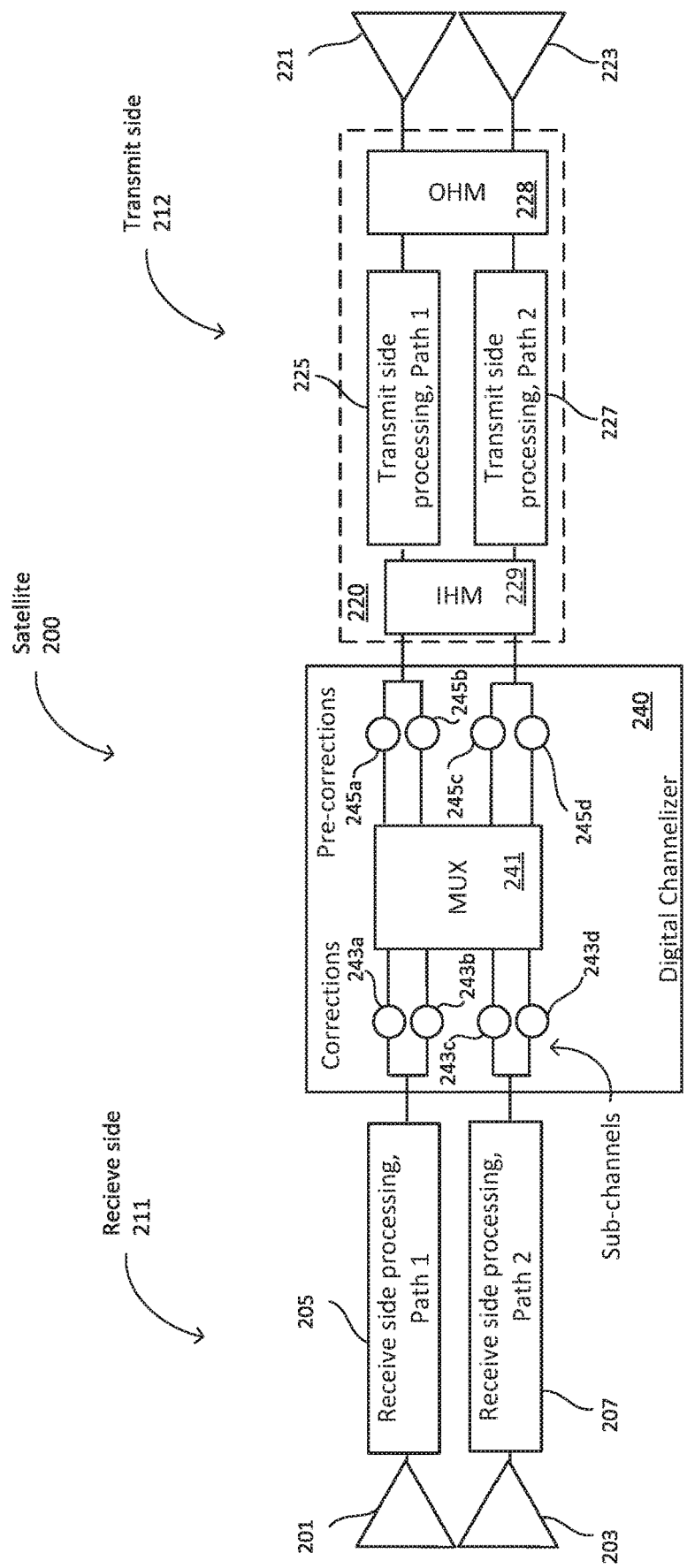
FIG. 2A is a block diagram of a satellite for an example of two input ports and two output ports.

FIG. 2A is a block diagram of a satellite for a simplified example of two input ports and two output ports, illustrating some of the elements that an embodiment of satellite 100 of FIG. 1 may include. Although FIG. 2A shows only two input ports and paths, and two output ports and paths for purposes of discussion, a real implementation of a satellite 100 as in FIG. 1 may have tens or even hundreds of such inputs, outputs and channels.

In this example, the receive side 211 of the satellite 200 includes two antennae or other input ports 201, 203 each connected to a corresponding input processing path 205, 207. The input paths include low noise amplifiers (LNAs) and other low power equipment (LPE), such as mixers, amplifiers and filters used to process the received signals, which are then separated out into sub-channels, where the example shows two sub-channels per channel. These elements can introduce relatively large phase, delay and gain variations, such as can be caused by temperature variations. In a satellite application, when power consumption is a major consideration, use of low power elements is important, but in other applications where such constraints are less important, higher power components can be used. To account for gain, phase and other variations in each of the sub-channels on the receive side, a set of calibration correction elements 243*a*-*d* are included in the sub-channel receive paths. These can be adjusted to calibrate the individual sub-channels, such as would be done during an initial calibration process for the receive side.

On the transmit side 212 of satellite 200, the two antennae or other output ports 221 and 223 are supplied signals from the output block 220. Output block 220 includes transmit side processing path 1 circuitry 225 and transmit side processing path 2 circuitry 227, which each include mixers, filters and amplifiers, including the high-powered amplifiers at the end, to generate the signals for the output ports 221 and 223. In the embodiment of FIG. 2A, the transmit side processing path 1 circuitry 225 and transmit side processing path 2 circuitry 227 is connected to the output ports 221 and 223 through output hybrid matrix OHM 228 on the one side and to the input hybrid matrix IHM 229 on the input side. The input hybrid matrix IHM 229 allows for a signal from any one of the sub-channels to be distributed across multiple transmit paths, and the output hybrid matrix OHM 228 allows signals from any of the transmit paths to be directed to any of the output ports. Rather having all transmit paths be able to handle the maximum amplification power that may be needed in a single channel, the use of the input hybrid matrix IHM 229 and the input hybrid matrix IHM 229 allows for the signal of a sub-channel to be distributed across multiple transmit paths so that unused amplification power in underutilized channels is used to supply extra power for sub-channels needing higher degrees of amplification. In some embodiments, the input hybrid matrix IHM 229 can be implemented in a digital embodiment as part of a virtual input hybrid matrix as part of the digital channelizer block 240. This division of amplification allows for the individual transmit paths to use amplifiers of lower power, and consequently less cost and lower weight, which is an important concern in a satellite. A set of calibration pre-correction elements 245a-d are included in the sub-channel paths are included to account for gain, phase and other variations in each of the transmit sub-channels on the transmit side. These can be adjusted to calibrate the individual transmit sub-channels, such as would be done during an initial calibration process for the receive side.

Figure 2B:
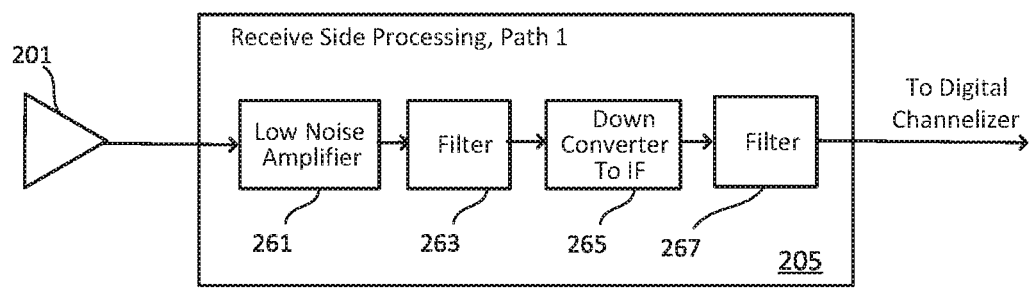
FIGS. 2B and 2C provide more detail on the receive paths and transmit paths of FIG. 2A.
Figure 2C:
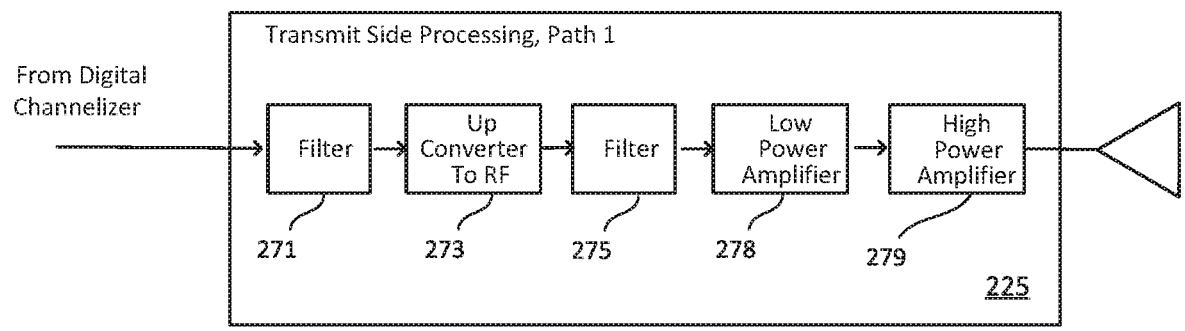

FIGS. 2B and 2C provide more detail on the receive paths and transmit paths of FIG. 2A. FIG. 2B is block diagram illustrating an embodiment of a receive side processing path block, such as 205 or 207 in FIG. 2A, in more detail. More specifically, FIG. 2B provides more detail on some of the elements of one embodiment of receive side processing path 1 205, where other receive paths would have a similar structure. The signal from the input port, such as an antenna 201, is initially received at a low noise amplifier 261. The amplified input signal is then filtered at block 263, down-converted from the received RF range to an intermediate frequency at block at block 265, before being filtered again at block 267. The signal is then sent on to the digital processing elements of the channelizer section 240 and separated out into sub-channels.

FIG. 2C provides more detail on some of the elements of one embodiment of the transmit side processing path 1 225 as connected between the input hybrid matrix IHM 229 and the output hybrid matrix 228, where other transmit paths would have a similar structure. The signal from the input hybrid matrix IHM 229 is filtered at block 271 and then up-converted from the IF range to the RF range in block 273, before being filtered again at block 275. The filtered and up-converted signals are then amplified initially by a low power amplifier 278 and then a high-power amplifier 279, before going on to the output hybrid matrix OHM 228. The input hybrid matrix IHM 229 and output hybrid matrix OHM 228 allow for formation of a Multi-Port Amplifier (MPA), such that different signals can be distributed across multiple high-power amplifiers from different paths to provide higher amounts of power for a signal than available from a single path, but without the need to have each path to be able to the worst case maximum amplification all by itself.

Referring again to FIG. 2A, this shows only two antennae, radiating elements, or other output ports 221 and 223, although a real implementation of a satellite 100 as in FIG. 1 may have tens or even hundreds of such inputs, outputs and channels. A user signal may be transmitted from single antenna, or from multiple antennae at the same time in a beamforming arrangement. Beamforming satellites transmit a signal from several antennae that form a beam at chosen locations though constructive and destructive interference between the different signals. To do this, the signals from the different output ports need to be sufficiently well calibrated with respect to one another so that they are beamforming when incident on the desired location.

Output block 220 includes the two paths, transmit side processing path 1 circuitry 225 and transmit side processing path 2 circuitry 227. Each of these paths can include elements such as mixers, filters and amplifiers, including the high-powered amplifiers at the end, to generate the signals for the output ports 221 and 223. The transmit side processing path 1 circuitry 225 and transmit side processing path 2 circuitry 227 are both connected to the output ports 221 and 223 through output hybrid matrix OHM 228 on the one side and to the input hybrid matrix JIM 229 on the input side. The input hybrid matrix IHM 229 allows for a signal from any one of the sub-channels to be distributed across multiple transmit paths, and the output hybrid matrix OHM 228 allows signals from any of the transmit paths to be directed to any of the output ports. This is an example of a 2×2 multiport amplifier (MPA).

Rather than having each path of an MPA individually be able to handle the maximum amplification power that may be needed in a single channel, the use of the input hybrid matrix IHM 229 and the output hybrid matrix OHM 228 in an MPA allows for the signal to be distributed across the amplification of multiple paths so that unused amplification power in underutilized channels can be used to supply extra power for paths needing higher degrees of amplification. This division of amplification allows for the individual transmit paths to use amplifiers of lower power, and consequently less cost and lower weight, which is an important concern in satellites and many other applications.

Figure 3:
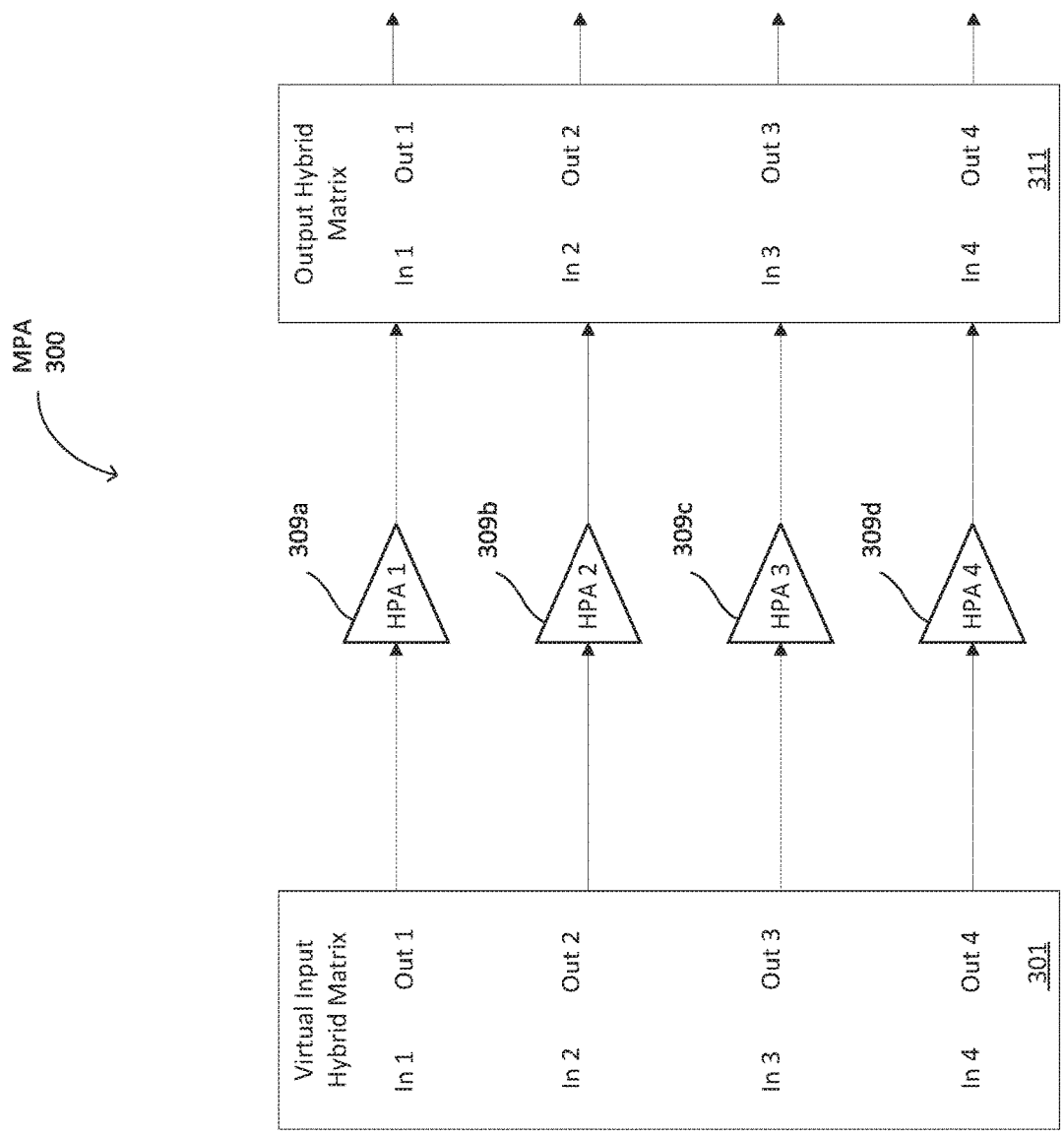
FIG. 3 is a block diagram of a 4×4 embodiment for a multiport amplifier (MPA).

FIG. 3 illustrates more detail for one example of an MPA 300, such as can be used at output block 220 of FIG. 2A or in other applications, here in a 4×4 embodiments of four input ports and four output ports. The four input ports of the MPA are the four inputs of the input hybrid matrix 301. In this embodiment, the input hybrid matrix 301 is a "virtual" input hybrid matrix as it is implemented digitally, but this need not be the case in other embodiments. The four outputs of the MPA are the four outputs of the output hybrid matrix 311. The four outputs of the input hybrid matrix 301 are connected to the four inputs along four amplification paths. The amplification paths can be similar to those described above with respect to FIG. 2C or other embodiments, but for this discussion each of the four paths is simplified to show one high-power amplifier HPA 309a-309d. In the representation of FIG. 3, any other elements in the paths between the input hybrid matrix 301 and output hybrid matrix 311 are omitted for simplicity of discussion.

Figure 4:
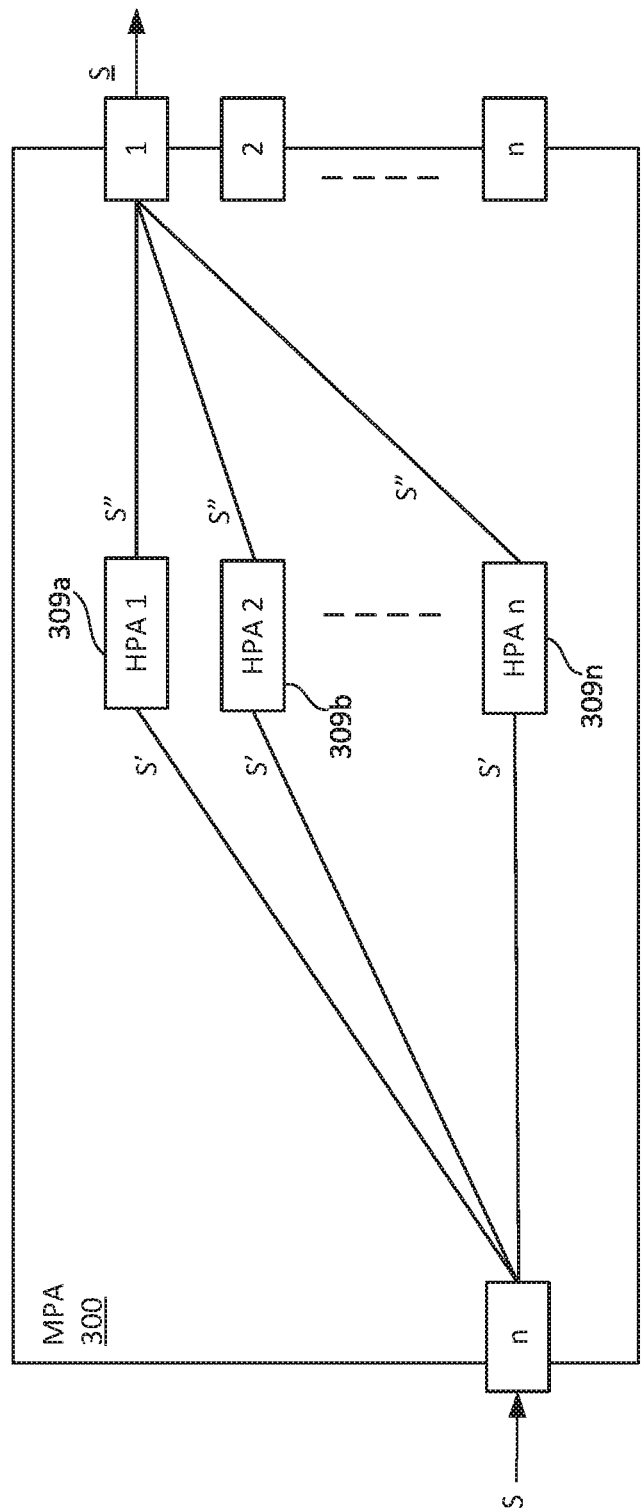
FIG. 4 illustrates the different paths from one input of a multiport amplifier to one of its outputs.

FIG. 4 considers the paths from one input of an MPA 300, such as illustrated in FIG. 3 except for a generalized n×n embodiment, to one of its outputs. In the simplified illustration of FIG. 4, an input signal S is received at an input port (input port n), distributed by the input hybrid matrix to the n paths, and is amplified by n amplification units HPA1-HPAn 309a-309n in parallel (input hybrid matrix 301 and output hybrid matrix 311 are omitted for simplicity). Signal S is split into signals S' that travel along parallel pathways through amplification stages 309a-309n. The amplified signals S" are then recombined and provided as an amplified output S at output port 1. FIG. 4 illustrates one input signal being distributed across all of the amplification pathways, but depending on the needed power and other signals concurrently in the MPA from other ports, a given input signal will be distributed across a subset of from 1 to all n of the amplification paths.

To accurately provide amplified output signals from the input signals, including for beam forming and/or MPA applications, the response of the high power RF amplifiers should have a linear response over the desired output power range. Above a certain power level the output of an amplifier will exhibit compression, where the output signal will flatten out and no longer provide a linear response. In the context of a satellite payload, when weight, size and power consumption are of particular importance, providing high power amplifiers that have high linearity while providing the proper amount of RF output power can be particularly difficult. To meet these requirements, the following presents the use of a Doherty type amplifier.

A Doherty power amplifier provides the input signal to two parallel branches or arms, having a main or carrier arm connected in parallel with an auxiliary or peaking arm. The amplifier of the auxiliary arm is used to enhance the signal of the amplifier of the main arm when the main arm goes into compression. Below a certain input level, the output is provided from the main arm, so that when the input signal is near its average level, the amplifier of the auxiliary arm is not operating. This can allow the main arm to operate near its most efficient level for lower output power. When the output power increases above a certain threshold, the auxiliary arm starts to operate and enhance the output from the main arm. This arrangement allows for the arms to work together to provide high DC to RF conversion efficiency at "backed off" power levels while maintaining the capacity to reproduce signal peaks high above the average signal power level.

Figure 5:
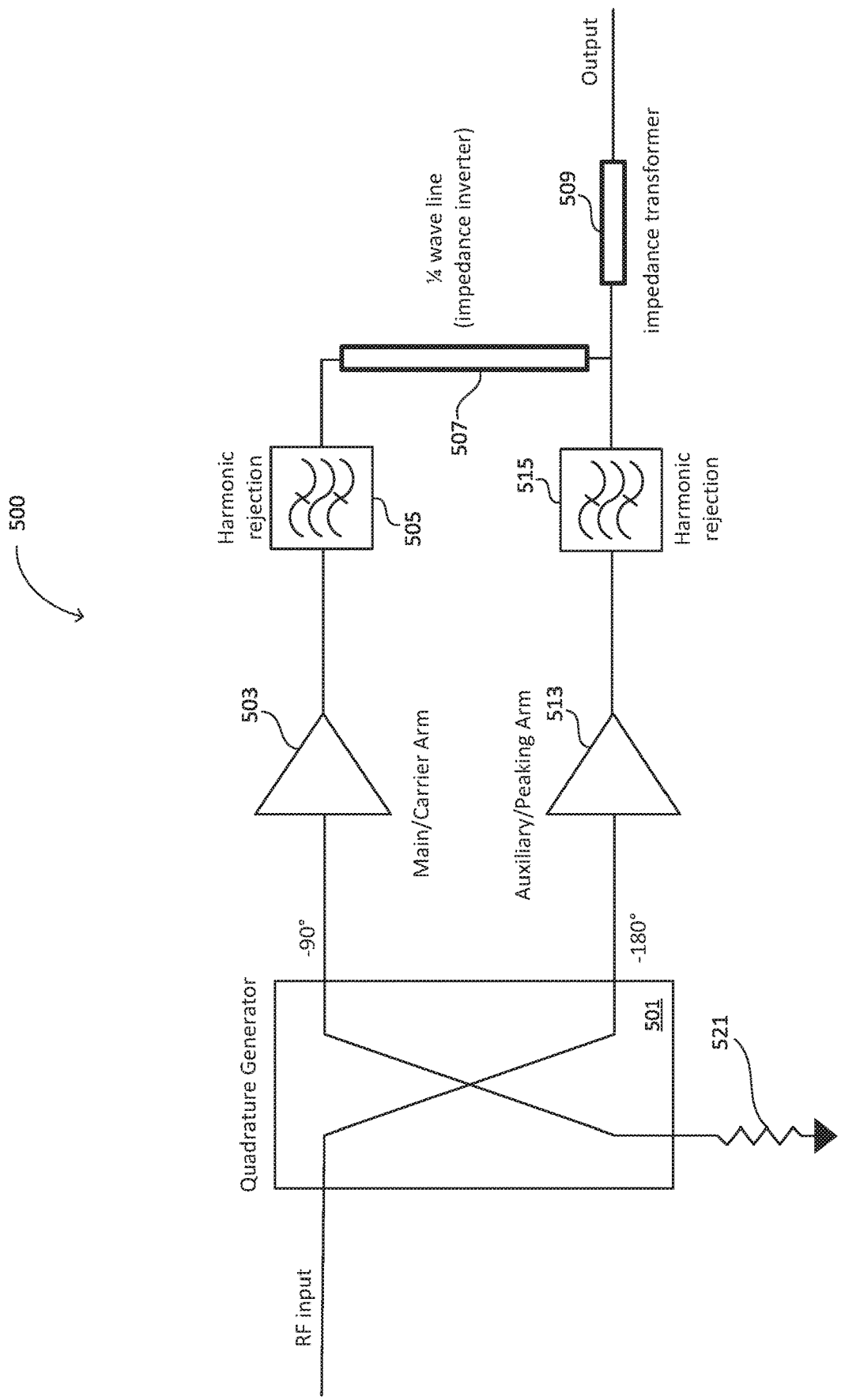
FIG. 5 is a schematic representation of a Doherty amplifier with a single amplifier stage in each arm.

FIG. 5 is a schematic representation of a Doherty amplifier 500 with a single amplifier stage in each arm. At left, an RF input is received an input splitter 501, where in the following embodiments the input splitter is a quadrature generator 501 that produces two outputs that are 90 degrees out of phase with one another. A resistive load 521 is connected at an isolated port, to which can be routed a significant portion of any reflected power from the amplifies 503 and 513. At top is the main or carrier arm with amplifier 503, which provides all of the output below a threshold input level. In the lower arm is the auxiliary or peaking arm with amplifier 513, which begins operation above the threshold input. The 90 degree split between the arms is introduced because the auxiliary arm amplifier 513 will have a 90 degree delay with respect to the main arm amplifier 503 in order to be in step with the main arm amplifier 503, which is subjected to a 90 degree delay in the ¼ wave impedance inverter 507 at its output.

The main amplifier 503 and auxiliary amplifier 513 are each passed through a respective harmonic rejection filter 505 and 515 and the combined to provide the gain for the Doherty power amplifier 500. Prior to combining, the output of the main amplifier 503 is passed through the ¼ wave line 507 as part of a combining circuit for the two arms, which combines the signal form the ¼ wave line 507 with the output of the auxiliary amplifier 513. The combined signals subsequently pass through the impedance transformer 509 to provide the output signal. This arrangement allows for the two arms to operate without loading each other undesirably, so that the auxiliary amplifier 513 does not load the main amplifier 503 and, once the main amplifier 503 is saturated, the main amplifier 503 does not load the auxiliary amplifier 513.

Figure 6:
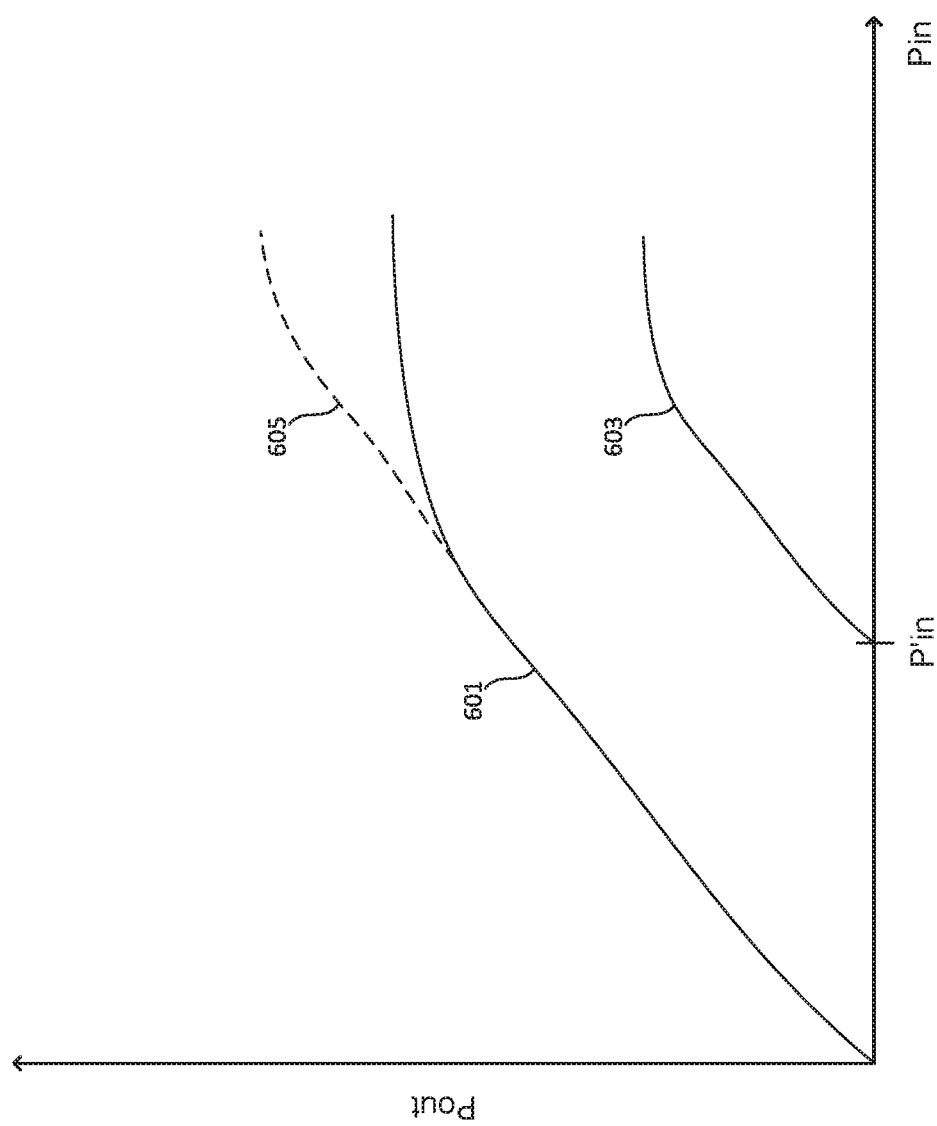
FIG. 6 is a plot of Pin versus Pout illustrating the behavior of the Doherty amplifier.

FIG. 6 is a plot of Pin versus Pout illustrating the behavior of the Doherty amplifier. The amplifier 503 of the main arm provides a Pout curve 601 that increases linearly with the Pin up to an input level of around P'in, after which it begins to roll-off due to compression. Also, at around P'in, the amplifier 513 of the auxiliary arm turns on with a Pout curve 603 that increases linearly from P'in, before eventually also beginning to go into compression. In one set of embodiments, the main arm's amplifier 503 can be a class AB type of amplifier and the auxiliary arm's amplifier 513 can be a class B or class C type of amplifier. The combined output is illustrated by the curve 605, which extends the linear region well past P'in and giving a linear Pout for an extended range of Pin values. Although a single arm amplifier can be arranged to have linear region extending further and provide a similar output to the curve 605, this would be achieved with lower efficiency if the main arm amplifier 503 was operated independently of the auxiliary arm amplifier 513. By having the main arm only be used alone below P'in and having the auxiliary arm beginning to contribute above P'in, this allows for the main arm to be backed off and results in the combined output of the Doherty amplifier operating with higher efficiency in the extended range. This makes such an arrangement particular attractive in applications, such as satellites, where power consumption is of particular importance.

Figure 7A:
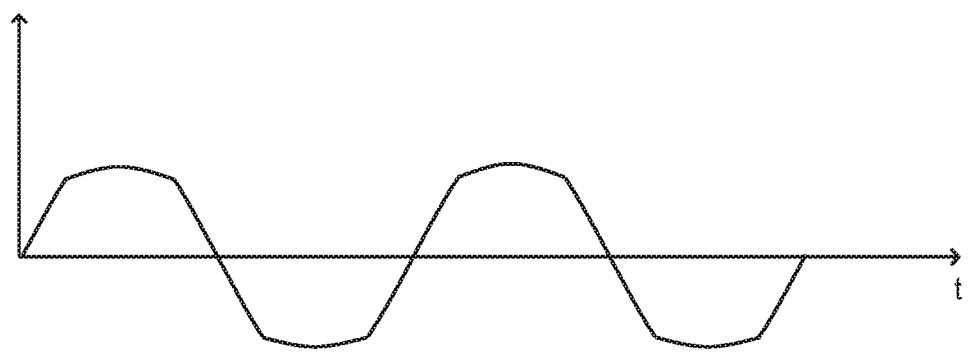
FIGS. 7A-7C further illustrate the operation of the Doherty amplifier with output waveforms for the individual arms and their combined output.
Figure 7B:
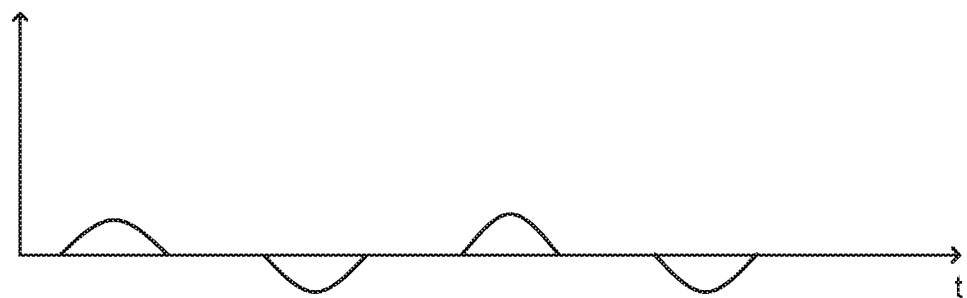
Figure 7C:
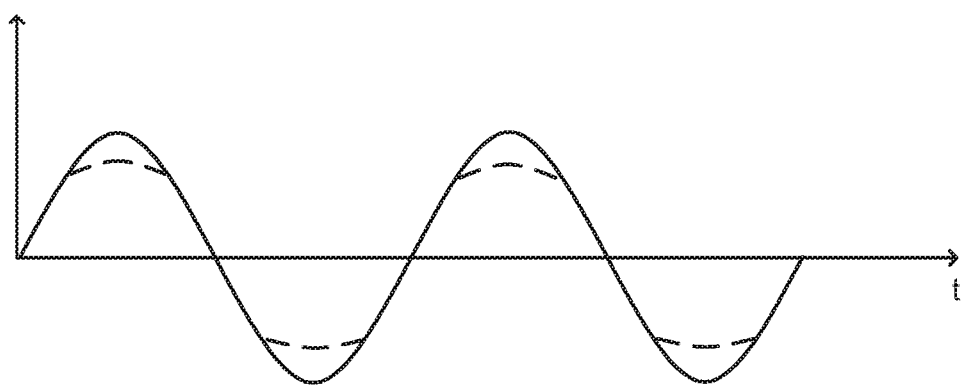

FIGS. 7A-7C illustrate how the behavior shown in FIG. 6 corresponds to an input waveform for a sine wave. FIG. 7A illustrates the output waveform from the main arm when the peak amplitude of the input signal is high enough that its amplifier 503 goes past its compression point. As the main arm amplifier 503 is compressing, the peaks of the waveform flatten out. FIG. 7B illustrates how the auxiliary arm's amplifier 513 provides an enhanced waveform, only contributing when the amplitude of the input signal exceeds the threshold value. FIG. 7C shows the combined output waveform, with the signal's fidelity restored.

The embodiments described here present techniques for controlling the RF output power level, DC power, and linearity of the Solid State Power Amplifier (SSPA) device through biasing. More specifically, the bias on different arms of a Doherty power amplifier Monolithic Microwave Integrated Circuit (MMIC) are set or adjusted to affect Pout, Pdc, and linearity. The bias levels can be set to achieve a specific goal for a flight set or adjusted in-orbit to adapt to different operating scenarios as needed. This arrangement can provide for high linearity in a satellite payload utilizing SSPAs, while providing the proper amount of RF output power (Pout) and DC power (Pdc), minimizing the number of designs that are required for a given satellite payload. The benefits of this arrangement include a reduction in the variety of parts in a satellite payload by leveraging the same MIMIC at different output power settings where, through proper biasing, the linearity, Pout, and Pdc in a payload can be optimized. The embodiments described can further support an SSPA with a range of output power levels and a variety of antenna configurations, including Single Element per Beam architectures through Direct Radiating Multi-Element per Beam architectures.

The embodiments presented here include SSPAs using a single or a combination of Doherty power amplifier(s) that contains DC bias circuitry and RF signal paths. The Doherty amplifiers can be a single MMIC in a variety of semiconductor processes or in a hybrid format using a combination of thin films and semiconductor devices. The Doherty amplifier can include a main arm or branch and an auxiliary arm or branch, where each branch of the Doherty amplifier can have one, two or more stages of amplification. Each amplifying stage within the main and auxiliary arms of the Doherty amplifier can have its own DC bias feeds. By adjusting the DC bias of the stages in each branch of the Doherty amplifier, the output power, linearity, and DC power can be adjusted. The key specifications in adjusting the bias levels can include maintaining desired Pdc and linearity while adjusting the power level in back-off.

Figure 8:
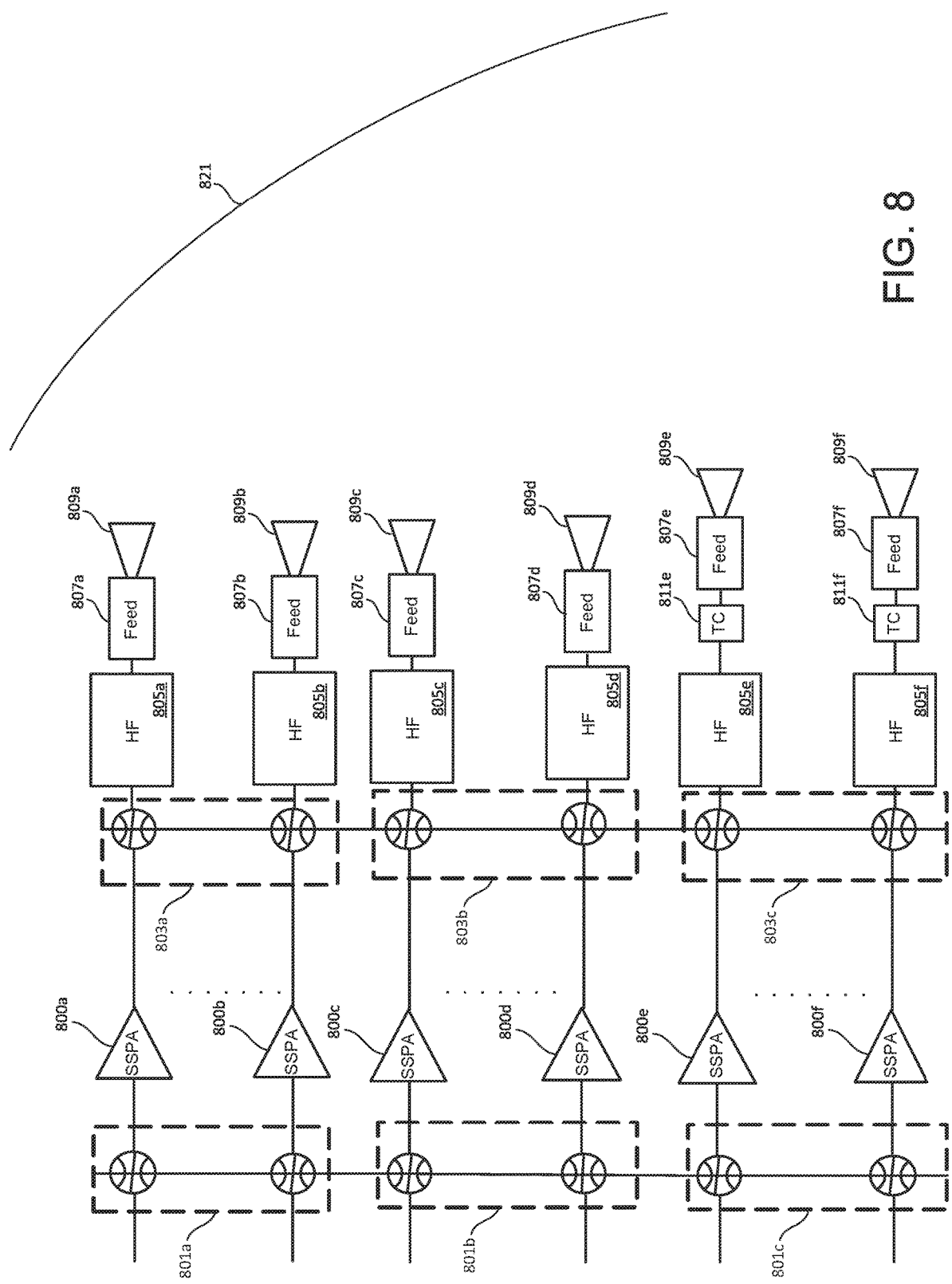
FIG. 8 is a block diagram of an embodiment for a multibeam, single element per beam satellite transponder output section.

FIG. 8 is a block diagram of an embodiment for a multibeam, single element per beam satellite transponder output section, such as could be used in the output block 220 of FIG. 2A. The high power amplifiers 279 of FIG. 2C are now implemented as SSPAs 800a-800f of the Doherty type. FIG. 8 shows explicitly shows six SSPAs 800a-800f, but more or less SSPAs can be used depending on the embodiment, where a typical satellite may have tens or even hundreds of such amplifiers. The input for each of the SSPAs 800a-800f is received from the digital channelizer block 240 of FIG. 2A though one of a group of signal selection or mixing circuits 801a-801c, where three such circuits are shown, but other embodiments may have fewer or, typically, more. The signal selection or mixing circuits 801a-801c allow for the different signals from the channelization circuit to be selectively supplied to the different SSPAs 800a-800f and can used for redundancy purposes (by switching out defective circuit elements), for multi-port amplifier (MPA) operation (by acting as an input hybrid matrix, as discussed above with respect to FIGS. 3 and 4), or a combination of these.

The output of the SSPAs 800a-800f are connected to the antennae or other output ports 809a-809f. FIG. 8 shows six antennae or other output ports 809a-809d, but more or less can be used depending on the embodiment, where a typical satellite may have tens or even hundreds of such antennae or other output ports. The antenna structure can include a reflector, such as illustrated to the right by the parabolic reflector 821. The outputs of each of the SSPAs 800a-800f are provided to the antennae or other output ports 809a-809f though one of a group of output signal selection or mixing circuits 803a-803c, where three such circuits are shown, but other embodiments may have fewer or, typically, more. The signal selection or mixing circuits 803a-803c allow for signals from different SSPAs 800a-800f to be supplied to the antennae or other output ports 809a-809f and can used for redundancy purposes (by switching out defective circuit elements), for multi-port amplifier (MPA) operation (by acting as an output hybrid matrix, as discussed above with respect to FIGS. 3 and 4), or a combination of these.

In the embodiment of FIG. 8, each of the antennae or other output ports 809a-809f is connected to the output signal selection or mixing circuits 803a-803c through a corresponding harmonic filter 805a-805f and any other feed elements grouped collectively at 807a-807f. Some or all of the paths can include a test coupler, such as shown at TC 811e and TC 811f. The test couplers TC 811e and TC 811f can be used to monitor the output of SSPAs or, through use of the output signal selection or mixing circuits 803a-803c, connected to receive the output of others of the SSPAs and used to provide feedback on the operation of the SSPAs 800a-800f for use in monitoring the output of the amplifiers to determine their biasing.

Figure 9:
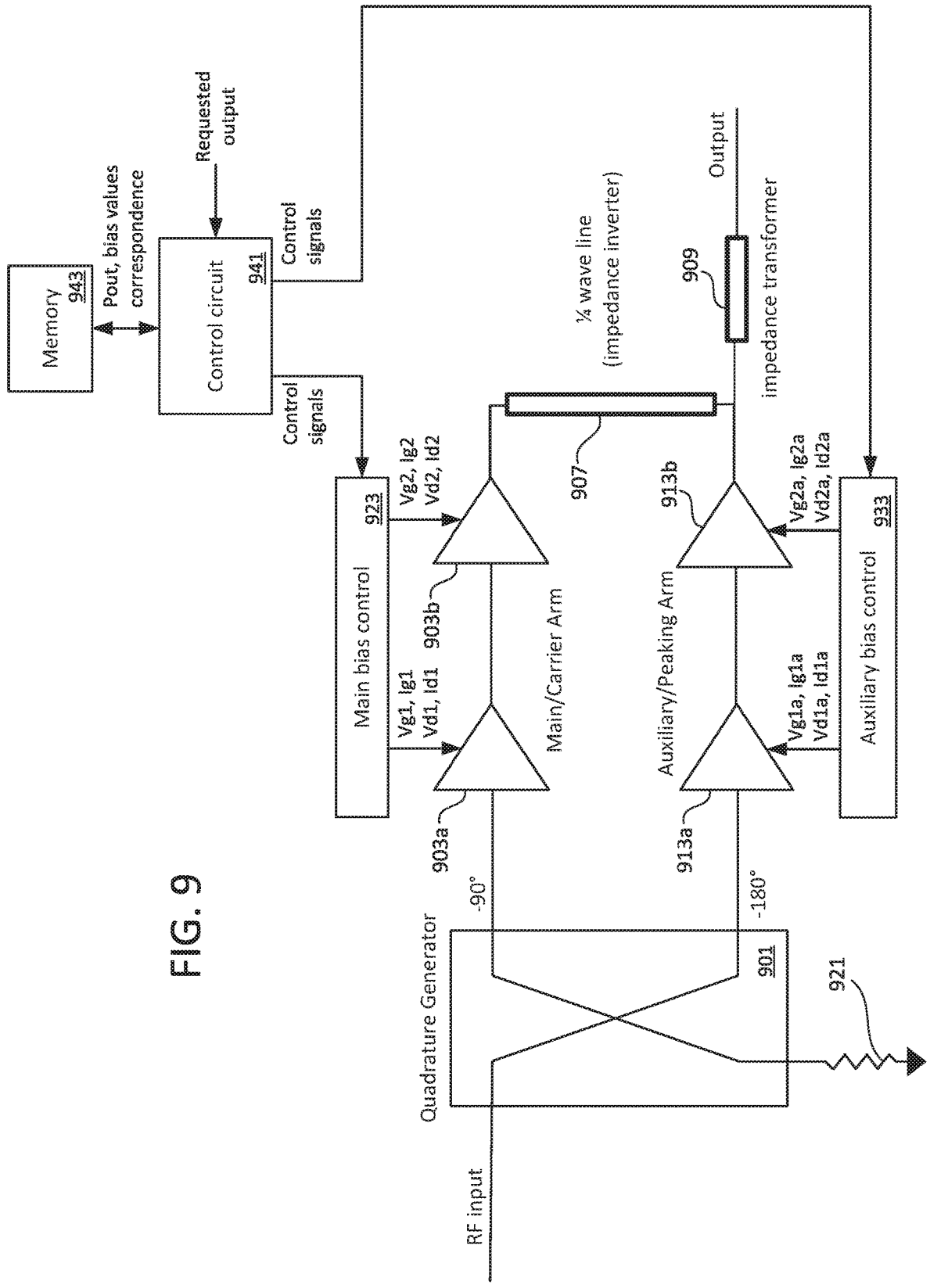
FIG. 9 illustrates a Doherty amplifier system with individual bias control for each of the individual stages in each of the arms, along with control circuitry for the bias control.

FIG. 9 illustrates an SSPA using a Doherty power amplifier system with individual bias control for each of the individual amplifying stages in each of the arms, along with control circuitry for the bias control circuits. More specifically, FIG. 9 shows a Doherty power amplifier arranged similarly to that discussed above with respect to FIG. 5, but now with two series connected amplifiers in both the main arm and in the auxiliary arm. Other embodiments can have one stage per arm, or more than two series connected stages per arm, but will typically have the same number of stages in each arm. Other elements, such as the harmonic rejection filters 505 and 515 of FIG. 5, can be included in each arm, but are not shown in FIG. 9 to simplify the representation for the following discussion. Relative to FIG. 5, FIG. 9 add elements so that the individual amplifying stages of each arm can be separately biased to provide the desired output characteristics for a specified output. Depending on the embodiment, a single MMIC may include a single such Doherty power amplifier or several such amplifiers, also including the control circuitry in some embodiments.

Considering FIG. 9 in more detail, the RF input, such as from one of selection or mixing circuits 801a-801c or a preceding SSPA, is received at the quadrature generator 901 (or, more generally, an input splitter), which has resistive load 921 connected at an isolated port. The outputs of the quadrature are supplied to the main or carrier arm and the auxiliary or peaking arm, where in this embodiment the main arm includes two series connected amplifier stages 903a and 903b in series and the auxiliary arm includes two series connected amplifier stages 913a and 913b. More generally, each of the main and auxiliary arms can include N stages that are, for N≥2, connected in series. After being amplified by amplifiers 903a and 903b, the main arm signal goes through the ¼ wave line 907 and is combined with the signal from the auxiliary arm that has passed through amplifiers 913a and 913b. The combined signal then passes through impedance inverter 909 to provide the output of the SSPA, which can then be supplied to one of the output signal selection or mixing circuits 803a-803c or a subsequent SSPA.

A main bias control circuit 923 is connected to each of the main arm's amplifiers to individual set one or more of the gate voltage Vg, gate current Ig, drain voltage Vd, and drain current Id of the corresponding amplifier. In this two stage example, the main bias control can set one or more of Vg1, Ig1, Vd1 and Id1 for amplifier 903a and one or more of Vg2, Ig2, Vd2 and Id2 for amplifier 903b. The auxiliary bias control circuit 933 can set one or more of Vg1A, Ig1A, Vd1A and Id1A for amplifier 913a and one or more of Vg2A, Ig2A, Vd2A and Id2A for amplifier 913b. By adjusting one or more of the Vds, Vgs, Ids and Igs of the Doherty power amplifier's individual amplifying stages, the satellite transponder can be adjusted according to a desired performance target.

Figure 10:
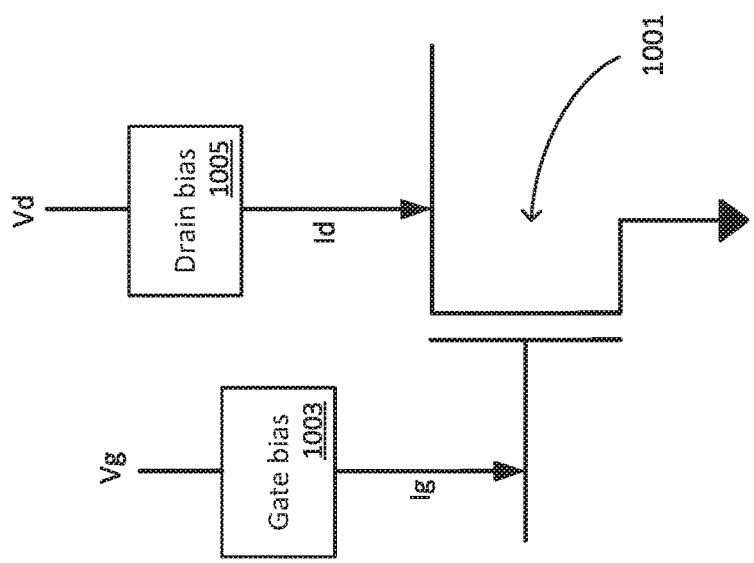
FIG. 10 is a block diagram to illustrate an example of how an individual biasing block can be connected to an amplifier in an embodiment where the amplifier stage is a single field effect transistor.

FIG. 10 is a block diagram to illustrate an example of how an individual biasing block can be connected to an amplifying stage in an embodiment where the stage is a single field effect transistor (FET). In FIG. 10. FET 1001 is connected between the stage output and ground, with the stage input connected to its gate. At the gate, a gate bias circuit 1003 is connected to receive a gate bias voltage Vg and supply a gate bias current Ig at the gate of FET 1001. At the drain, a drain bias voltage 1005 is connected to receive a drain bias voltage Vd and supply a drain bias current at the drain. The drain and gate biasing can be adjusted based on the desired output response of the FET 1001. In one set of embodiments for a Doherty power amplifier, to provide the sort of behavior illustrated in FIG. 6 for the main and auxiliary arm's amplifiers, different classes of amplifiers can be used for the different arms. For example, class AB amplifiers can be used for the stages of the main arm and class B or class C for the stages of the auxiliary arm.

Returning to FIG. 9, a control circuit 941 is connected to the main bias control circuit 923 and the auxiliary bias control circuit 933 to provide the corresponding sets of control signals from which the bias control circuit set or adjust the bias levels on the amplifiers of the two arms. The control circuit 941 can be implemented in hardware, software, firmware or some combination of these and be a circuit specifically for this purpose or a more general control circuit with other functions. Depending on the embodiment, the control circuit 941 can be part of the same MIMIC on which the Doherty amplifier is formed or part of a separate circuit. For example, a single control circuit 941 may be the control circuit for Doherty power amplifiers on multiple MMICs and be a dedicated control circuit or a processor or other controller that also has other functions on the satellite.

In some embodiments, a single MMIC may include multiple ones of the Doherty power amplifier circuits that include a common control circuit 941.

Figure 14:
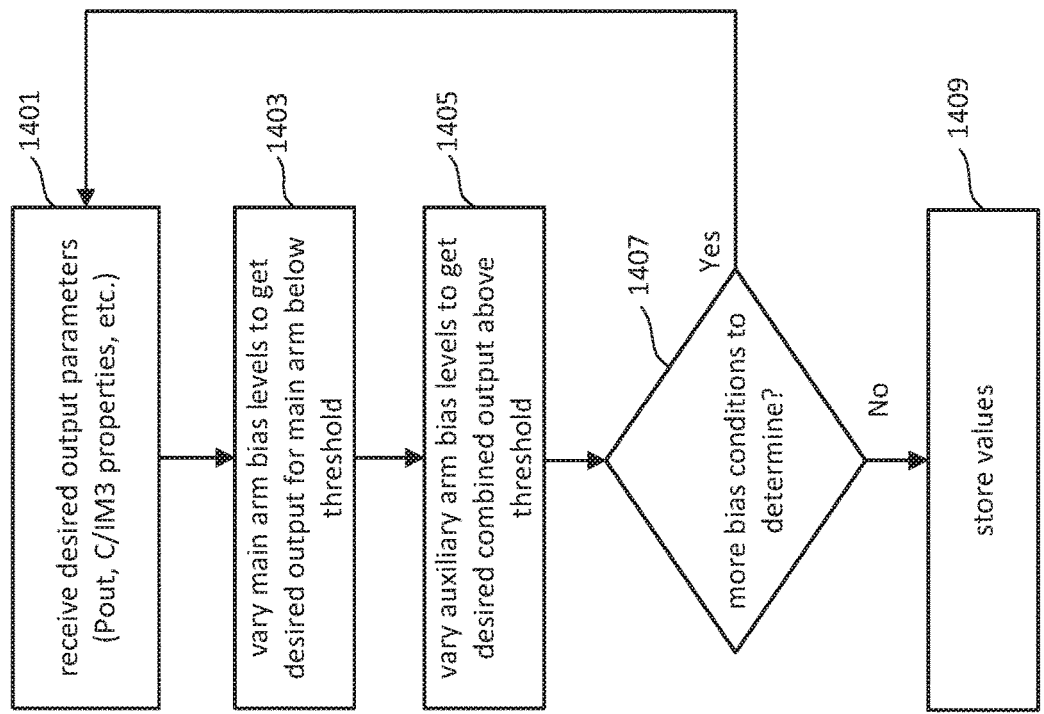
FIG. 14 is a flow chart describing one embodiment of a process for determining bias values to use to provide a desired output.

The control circuit receives an input specifying a desired output (e.g., power level), and sets bias levels of main arm's amplifiers, and bias levels of auxiliary arm's amplifiers relative to main arm, to provide desired output over specified output power output range. The bias levels corresponding to a specified output can be based on an initial determination process and stored in a memory (such as a look-up table, or LUT) from which they can be accessed. FIG. 14 below presents an embodiment for how these look-up table values can be determined. In other embodiments, the bias levels can be determined from the specified output based on functional relationships. In other alternates, the bias levels can alternately, or additionally, be determined based on monitored the output of the Doherty power amplifiers, such as by using test couplers TC 1111e and TC 1111f.

The control circuit 941 can be connected to a memory 943 that can store bias values corresponding to a specified output (e.g., a Pout value), such as in the form of a look-up table. When the control circuit 941 receives an input specifying an output, the control circuit 941 can retrieve the corresponding bias values. The look-up table value can be determined and loaded into the memory 943 before the satellite is put into service.

Figure 11:
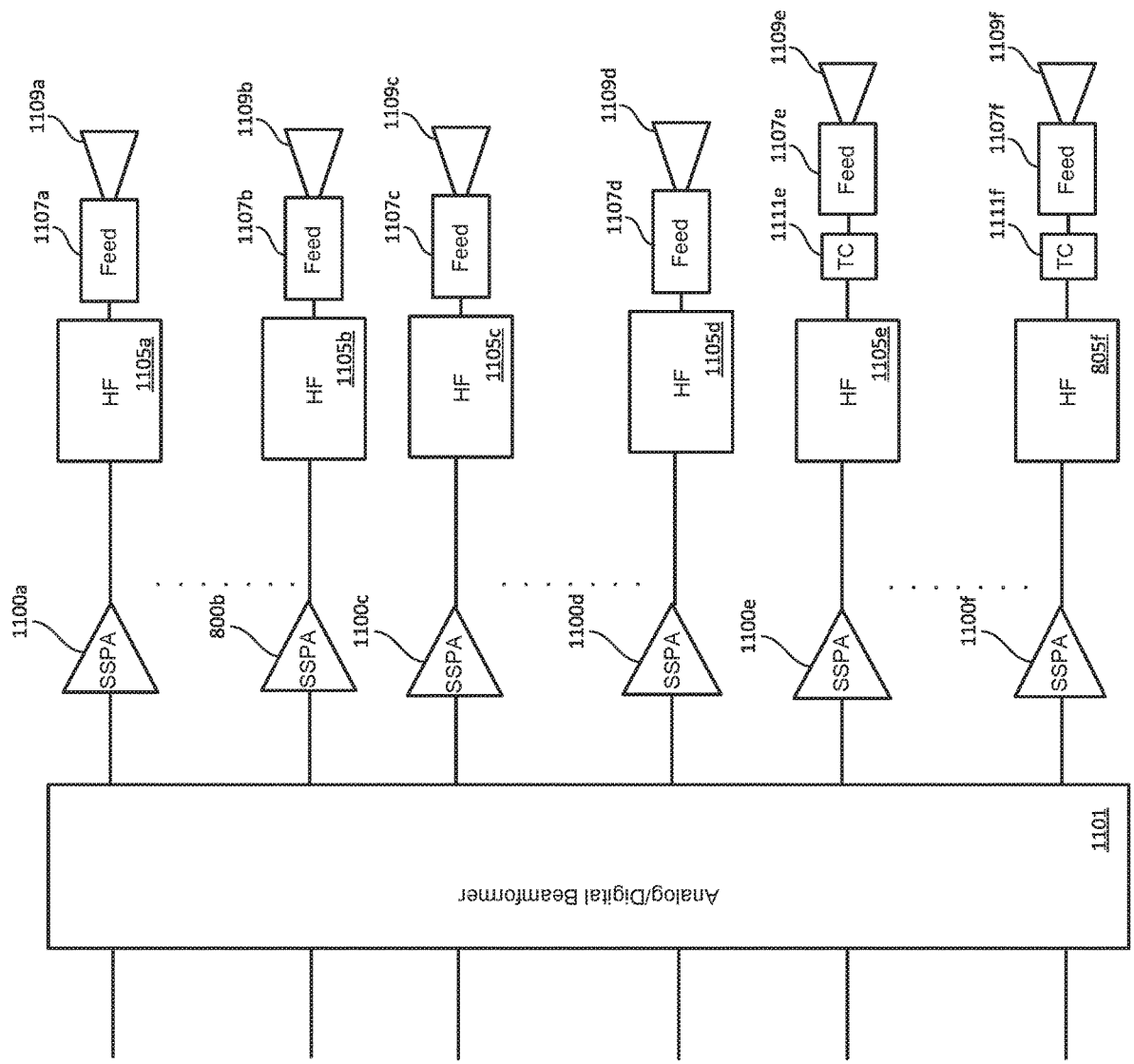
FIG. 11 is a block diagram of an embodiment for a multibeam direct radiating antenna satellite transponder output section.

FIG. 11 is a block diagram of an embodiment for a multibeam direct radiating antenna satellite transponder output section, such as could be used in the output block 220 of FIG. 2A. The high power amplifiers 279 of FIG. 2C are implemented as SSPAs 1100a-1100f of the Doherty type. The embodiment of FIG. 11 shows explicitly shows six SSPAs 1100a-1100f, but more or less SSPAs can be used depending on the embodiment, where a typical satellite may have tens or even hundreds of such amplifiers. In the embodiment of FIG. 11, each of the SSPAs 1100a-1100f can be as illustrated in FIG. 9. The input for each of the SSPAs 1100a-1100f is received from a beamforming circuit 1101. As discussed above with respect to FIG. 2A, in a beamforming system, the signals from multiple ones of the output ports or radiating elements 1109a-1109f are arranged to constructively interfere and form a beam at chosen locations. The beamforming circuit generates the inputs for the SSPAs 1100a-1100f to have the proper phase and amplitude relationships so that the needed signals are supplied to the output ports or radiating elements 1109a-1109f to properly form the beams.

The output of the SSPAs 1100a-1100f are connected to the radiating elements or other beamforming output ports 1109a-1109f of the antenna array. FIG. 11 shows explicitly shows six radiating elements or other output ports 1109a-1109d, but more or fewer antennae or other output ports can be used depending on the embodiment, where a typical satellite may have tens or even hundreds of such radiating elements or other output ports in an array antenna. FIG. 11 may also include a reflector, such as 821 in FIG. 8. When a reflector is included, this arrangement forms an Array Fed Reflector Antenna (AFRA) and, when such a reflector is not included, it forms a Direct Radiating Antenna (DRA). In the embodiment of FIG. 11, each of the radiating elements or other output ports 1109a-1109f is connected to a corresponding one of the SSPAs 1100a-1100f through a corresponding harmonic filter 1105a-1105f and any other feed elements grouped collectively at 807a-807f. Some or all of the paths can include a test coupler, such as shown at TC 1111e and TC 1111f. The test couplers TC 1111e and TC 1111f can be used to monitor the output of SSPAs to provide feedback on the operation of the SSPAs 1100e and 1100f for use in their biasing.

In the embodiment of FIG. 11, the SSPAs can again be Doherty power amplifiers systems as described above with respect FIG. 9. Each of the arms of the Doherty power amplifier systems can have one or more amplifier stages, where, for multiple stages, the stages in each arm are connected in series. For higher power, an SSPA can use multiple Doherty power amplifiers connected in series, either on a common MMIC or separate MMICs. As described with respect to FIG. 9, the amplifies of each of the arms can be individually biased to provide the desired performance. For the beamforming case of FIG. 11, the bias control circuits 923 and 933 also adjust the Vd, Id, and Vg, Ig value of each of the individual amplifiers of the Doherty power amplifier to achieve the satellite transponder's desired array taper in order to properly form the desired beams.

Figure 12:
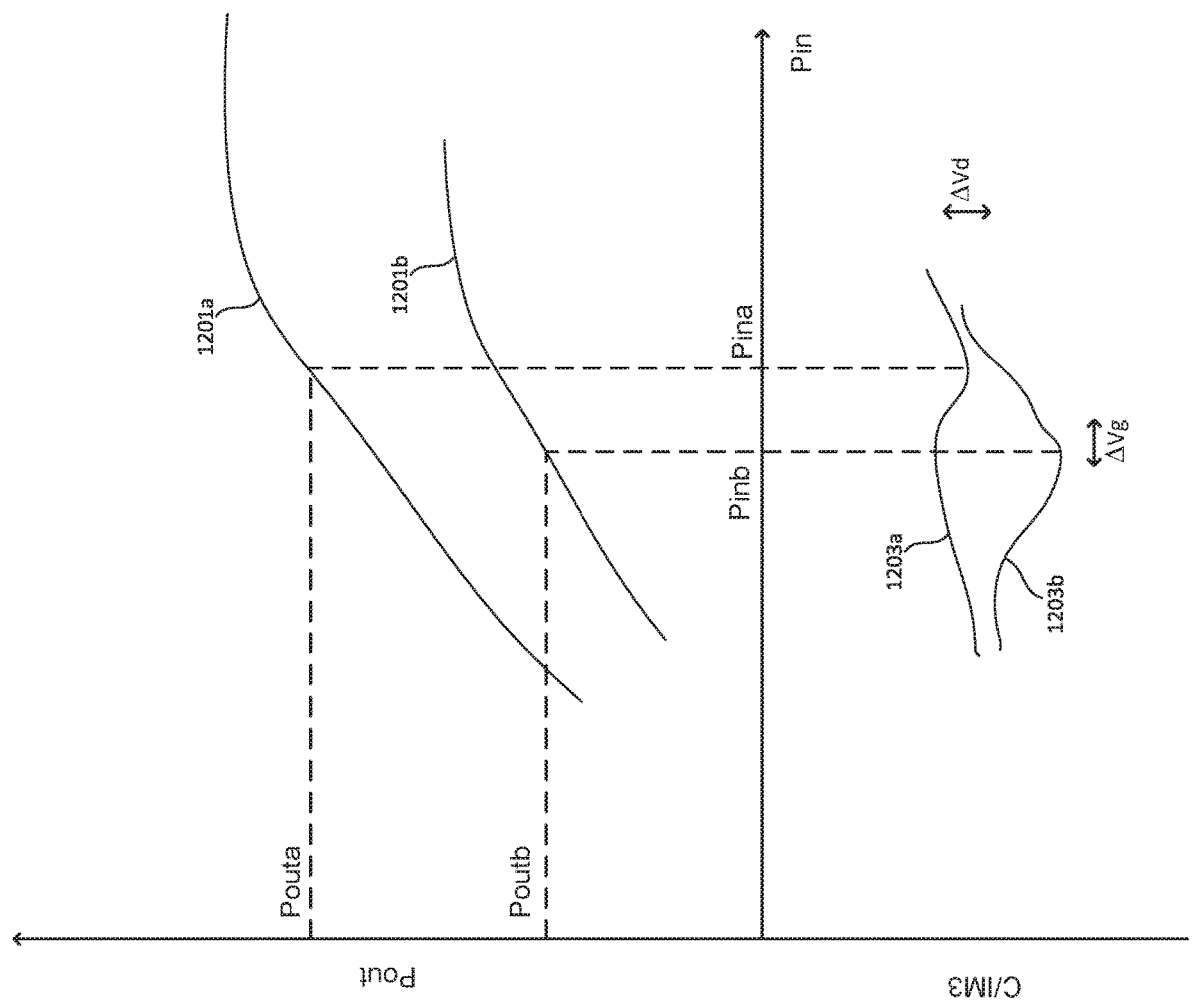
FIG. 12 illustrates the effect on the output section of varying bias conditions.

FIG. 12 illustrates the effect on the output section of varying bias conditions. More specifically, FIG. 12 is a plot of Pout vs. Pin and C/IM3 vs. Pin for two different sets of bias conditions, where C/IM3 is the carrier to third order intermodulation ratio, which is a common measure of signal efficiency. To minimize distortion for a specified output power, the C/IM3 value at the corresponding input power should be as low as can practically be obtained. A C/IM3 curve typically has local minimum, or dip. By adjusting to the bias conditions of the Doherty power amp, the local minimum of the C/IM3 curve can be shifted to locate this minimum at the Pin value corresponding to the desired Pout value, so that the distortion about this Pout value can be made as low as practical. Although the discussion here is given in terms of the C/IM3 value, other embodiments can adjust the bias values to optimize other signal characteristics.

FIG. 12 illustrates a first Pout vs. Pin curve 1201a and a second Pout vs. Pin curve 1201b and, for each of these curves, a corresponding C/IM3 vs. Pin curve 1203a and 1203b, respectively. The C/IM3 curves are commonly expresses as decibels relative carrier, or dBc, which is the power ratio of a signal to a carrier signal express in decibels and here are negative. Varying the bias conditions will alter the C/IM3 curve, where, generally, speaking, changes in the drain voltage (ΔVd) will move the C/IM3 curve up and down and changes in the gate voltage (ΔVg) move the C/IM3 curve sideways. By varying the bis conditions of the main arm of the Doherty amplifiers and varying the bias conditions of the auxiliary arm relative to the main arm, the width of the local minimum and other characteristics of the C/IM3 curve can be varied.

A discussed above with respect FIG. 6, the Pouta curve 1201a and Poutb curve 1201b are the combined output of the main arm and the auxiliary arm of the Doherty power amplifier. Below a threshold Pin value, which may be different in the two cases and can be adjusted based on the different sets of bias conditions, the contribution to Pout will only be from the main arm. Once Pin exceeds the corresponding threshold for a set of bias conditions, Pout will correspond to the combined output of both arms. In selecting the appropriate bias conditions, these are selected so that below the Pin threshold the main arm provides the desired behavior. The auxiliary arm's bias conditions are selected relative to the main arm's bias conditions so that for Pin values above the Pin threshold, the combined output of the two arms provide the desired output characteristics.

Pout vs. Pin curve 1201a is an example of the bias conditions for a Doherty power amplifier optimized for efficiency around an output power level Pouta. The control circuit 941 would set these bias conditions based upon an output power level of Pouta being specified, obtaining the bias conditions from a look-up table stored in the memory 943, for example. For curve 1201*a*, the input power level corresponding to Pouta is Pina. The bias conditions are selected so that the local minimum of the corresponding C/IM3 is at Pina, so that the Doherty power amplifier's efficiency is optimized for Pouta. In some embodiments, the bias conditions can be selected to optimize the amplifier's response for a width of output power levels in addition to where the range is centered. By selecting bias levels for the main arm and bias conditions for the auxiliary arm to affect both the location of the local minimum for C/IM3 curve 1203 *a*, but also the relative width of the dip.

If the specified Pout value is subsequently changed, the control circuit 941 will change the bias conditions according to the new Pout value. For example, if the control circuit is requested to switch to an output power level around Poutb, the control circuit 941 selects the corresponding bias conditions resulting in Pout vs. Pin curve 1201*b*, where the Pin value corresponding to Poutb is Pinb. The Doherty power amplifier is biased so that the local minimum of the corresponding C/IM3 curve 1203*b* has its local minimum at Pinb.

Figure 13:
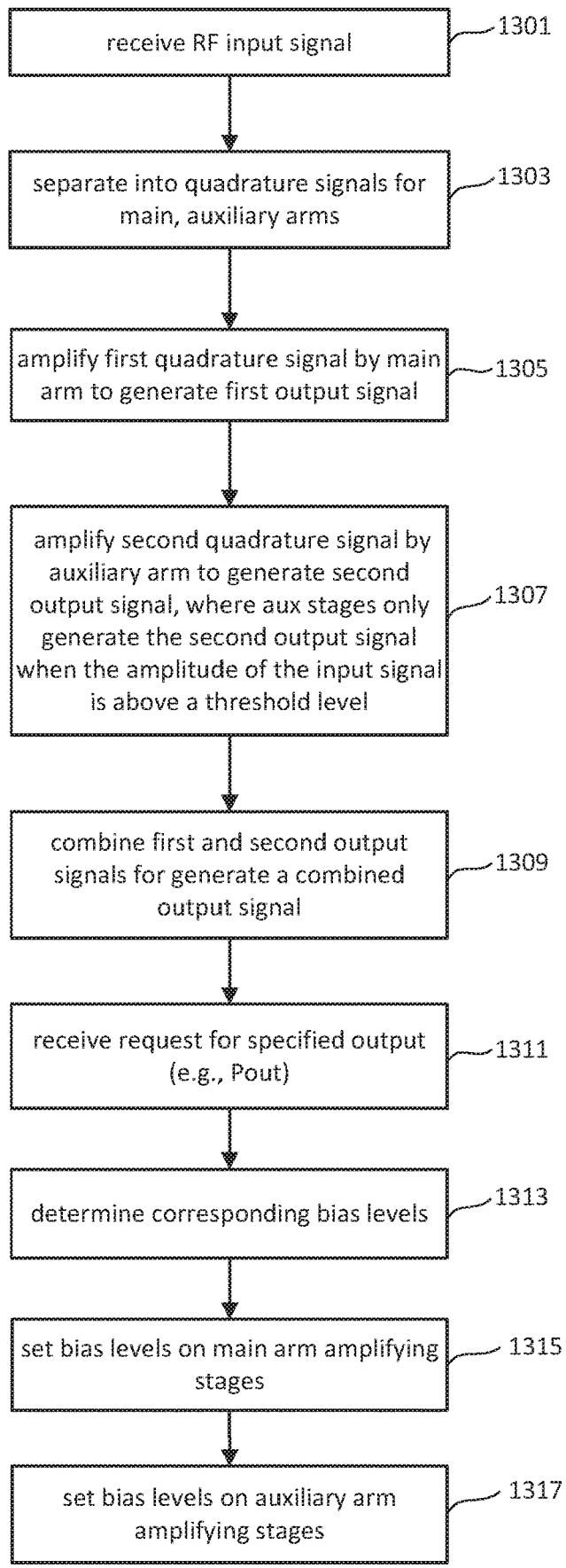
FIG. 13 is a flow chart describing one embodiment of a process for adjusting the bias conditions of the output section for a desired output.

FIG. 13 is a flow chart describing one embodiment of a process for adjusting the bias conditions of the output section for a desired output. At step 1301, the RF input is received at the Doherty power amplifier. Referring to the embodiment of FIG. 9, it is initially received at the quadrature generator 901, where at step 1303 it is separated out into the out of phase components for the main and auxiliary arms. At step 1305 a first of the quadrature signals is amplified by the amplifying stages of the main arm, such a amplifiers 903*a* and 903*b* in FIG. 9, to generate a first output signal. As discussed above with respect to FIG. 6, the amplifiers of the main arm will amplify the input signals even when their amplitude is below the threshold level at which the amplifiers of the auxiliary arm will kick in. At step 1307 the second of the quadrature signals is amplified by the amplifying stages of the auxiliary arm, such a amplifiers 913*a* and 913*b* in FIG. 9, to generate a second output signal. The amplifiers of the auxiliary arm will amplify the input signals only when their amplitude is above the threshold level. Step 1309 combines the output of the two arms to generate the output signal for the full output of the Doherty power amplifier. As the original signal for the two arms were provided by the quadrature generator, the two arm's outputs can be put back in phase by use of a quarter wave line 907, for example.

Steps 1311, 1313, 1315 and 1317 set the bias levels for the amplifying stages of the main arm and auxiliary arm. At step 1311 a request for a specified output is received, such as at the control circuit 941 of FIG. 9. This can be the specification for the initial output signals used when the amplifier starts up or a request to subsequently change the output. For example, the request may be specifying a new output power level or other (or additional) output parameters (frequency, center and range of output power, etc.) or operating conditions. Step 1313 determines the bias levels corresponding to the requested output, such as be retrieving them from the memory 943 where are stored in a look-up table or other format, determining them by a set of algorithms or functional relationships, or monitoring of the amplifiers output, for example. Depending on the embodiment, this may be a single set of bias values for a requested power output level or range, or there may be multiple sets of bias values for a given power output to account for other specified output properties at this output power, such as low C/IM3 values. At step 1315 the bias levels are set on the main arm's amplifying stages according to the bias values determined at step 1313 for the specified output for a first output range (i.e., when the corresponding Pin is below the threshold value) for the first output. Step 1317 sets the bias levels on the auxiliary arm's amplifying stages according to the bias values determined at step 1313 so that the combined first and second output signals have the specified response over a second output range (i.e., when the corresponding Pin is above the threshold value).

As discussed above, the bias values corresponding a specified output can be determined by monitoring the output, by a set of algorithms or functional relations, or previously determining the bias values and storing these so that the Doherty power amplifier system can access them as needed. FIG. 14 is a flow chart describing one embodiment of a process for determining bias values to use to provide a desired output.

FIG. 14 begins at step 1401 with receiving the requested output parameters for the Doherty power amplifier design, such as a Pout value or range and properties for this output, such as having the C/IM3 curve having a local minimum at this Pout and perhaps how broad or sharp the C/IM3 curve is about the specified Pout value. In step 1403, the bias levels on the amplifying stages of the main arm are varied to determine the values that best provide the desired output from the main arm when the Pin level is below the threshold at which the auxiliary arm contributes. At step 1403, the bias levels on the amplifying stages of the auxiliary are arm are varied to determine the values that provide the desired combined output from both the auxiliary arm and the main arm when the Pin level is above the threshold at which the auxiliary arm contributes. Depending on the embodiment and the desired output, steps 1403 and 1405 may need to be iterated back and forth several times, or performed concurrently, where this may include varying the threshold before the output behavior is optimized for the specified parameters. Step 1407 determines whether bias conditions for more sets of output parameters are to be determined and, if so, the process loops back to step 1401 for these additional sets of output parameters. Once all the requested bias condition values are determined, at step 1409 the values are stored in the memory used by the Doherty power amplifier system, where they can be accessed when adjusting the bias levels, as in step 1313 of FIG. 13.

In a first set of embodiments, a solid state amplifier includes an input port, an output, a main arm connected between the input port and the output port, and an auxiliary arm connected in parallel with the main arm between the input port and the output port. The main arm includes a first main amplifier stage configured to generate a first output signal from an input signal received from the input port. The auxiliary includes a first auxiliary amplifier stage configured to generate a second output signal by amplifying portions of the input signal received the input port having an amplitude above a threshold level. An input splitter is configured to receive the input signal and provide it to the main arm and the auxiliary arm. A combining circuit is configured to receive the first output signal and the second output signal, generate therefrom a combined output signal and provide the combined output signal to the output port. A first bias control circuit is connected to the first main amplifier stage and configured to bias the first main amplifier stage according to a corresponding first set of control signals, and a second bias control circuit is connected to the first amplifier stages and configured to bias the first auxiliary amplifier stage according to a corresponding second set of control signals. A control circuit is configured to generate the first and second sets of control signals, the first set of controls signals are configured to generate the first output signal to have a specified response over a first output range when the input signal has an amplitude below the threshold level, and the second set of control signals are configured relative to the first set of control signals to generate the combined first and second output signals to have the specified response over a second output range when the input signal has an amplitude above the threshold level.

Other embodiments present methods including receiving an input signal, generating by N main amplifying stages of a first output signal from the input signal, and generating by N auxiliary amplifying stages of a second output signal from the input signal. For N greater than one, the N main amplifying stages are connected in series. The auxiliary amplifier stages configured to generate the second output signal by amplifying portions of the input signal having an amplitude above a threshold level, and, for N greater than one, the N auxiliary amplifying stages are connected in series. The method also includes combining the first output signal and the second output signal to generate a combined output signal, receiving a first specification for the combined output signal, and individually biasing the main amplifying stages and the auxiliary amplifying stages to provide the combined output signal according to the first specification.

In another set of embodiments, a satellite includes multiple receive antennae and multiple transmit antennae. A plurality of solid state power amplifiers are coupled between the receive antennae and the transmit antennae, each of the solid state power amplifiers having a Doherty amplifier having a main arm, an auxiliary arm, and biasing circuitry configured to independently bias the main arm and the auxiliary arm according to a set of control signals. A control circuit is configured to receive a specified power output for each of the Doherty amplifiers and provide a corresponding set of control signals to independently bias the main arm and the auxiliary arms according to the specified power output.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for Identification purposes to Identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A satellite, comprising:
a plurality of receive antennae;
a plurality of transmit antennae;
a plurality of solid state power amplifiers coupled between the plurality of receive antennae and the plurality of transmit antennae, each of the solid state power amplifiers comprising:
 a Doherty amplifier having a main arm, an auxiliary arm, and biasing circuitry configured to independently bias the main arm and the auxiliary arm according to a set of control signals; and
a control circuit configured to receive a specified power output for each of the Doherty amplifiers and provide a corresponding set of control signals to independently bias the main arm and the auxiliary arms according to the specified power output, each of the solid state power amplifiers comprising:
an input port connectable to one or more of the receive antennae;
an output port connectable to one or more of the transmit antennae, wherein the main arm is connected between the input port and the output port and includes a first main amplifier stage configured to generate a first output signal from an input signal received from the input port, and wherein the auxiliary arm is connected in parallel with the main arm between the input port and the output port and includes a first auxiliary amplifier stage configured to generate a second output signal by amplifying portions of the input signal received the input port having an amplitude above a threshold level;
an input splitter configured to receive the input signal and provide it to the main arm and the auxiliary arm;
a combining circuit configured to receive the first output signal and the second output signal, generate therefrom a combined output signal and provide the combined output signal to the output port; and
wherein the biasing circuitry includes:
 a first bias control circuit connected to the first main amplifier stage and configured to bias the first main amplifier stage according to a corresponding first set of control signals; and
 a second bias control circuit connected to the first auxiliary amplifier stage and configured to bias the first auxiliary amplifier stage according to a corresponding second set of control signals, and
 wherein the control circuit is configured to generate the corresponding first set of control signals and the corresponding second sets of control signals, the first set of controls signals configured to generate the first output signal to have the power output over a first output range when the input signal has an amplitude below the threshold level, and the corresponding second set of control signals configured relative to the corresponding first set of control signals to generate the combined output signal to have the specified power output over a second output range when the input signal has an amplitude above the threshold level.

2. The satellite of claim 1, further comprising:
an input hybrid matrix coupled to multiple ones of the receive antennae; and
an output hybrid matrix coupled to multiple ones of the transmit antennae, wherein the plurality of solid state power amplifiers are coupled between the input hybrid matrix and the output hybrid matrix to amplify signals from the input hybrid matrix as a multiport amplifier.

3. The satellite of claim 1, further comprising:
a beamforming circuit connected between the plurality of receive antennae and the plurality of solid state power amplifiers, wherein the beamforming circuit is configured generate a plurality of input signals for a corresponding plurality of the solid state power amplifiers to generate an output forming a beam when transmitted from a corresponding plurality of the transmits antennae.

4. The satellite of claim 1, wherein the control circuit is further configured to receive an updated specified power output for each of the Doherty amplifiers and provide a corresponding updated set of control signals to independently bias the main arm and the auxiliary arms according to the updated specified power output.

5. The satellite of claim 1, wherein, for each of the solid state power amplifiers:
the main arm comprises a plurality of N serially connected main amplifier stages, including the first main amplifier stage, connected to the input port and configured to generate the first output signal from the input signal;
the auxiliary arm comprises a plurality of N serially connected auxiliary amplifier stages, including the first auxiliary amplifier stage, connected to the input port and configured to generate the second output signal from the input signal;
the first bias control circuit is connected to the N main amplifier stages and configured to individually bias the N main amplifier stages according to the corresponding first set of control signals; and
the second bias control circuit connected to the N auxiliary amplifier stages and configured to individually bias the N auxiliary amplifier stages according to the corresponding second set of control signals.

6. The satellite of claim 1, wherein the control circuit is configured to change the corresponding first set of control signals and the corresponding second set of control signals in response to the specified power output being changed.

7. The satellite of claim 6, wherein the changed corresponding first set of control signals and the corresponding second set of control signals change the threshold level.

8. The satellite of claim 1, wherein further composing:
a memory, where the control circuit determines the corresponding first set of control signals and the corresponding second set of control signals corresponding to the specified response from values stored in the memory.

9. The satellite of claim 1, wherein the control circuit determines the corresponding first set of control signals and the corresponding second set of control signals corresponding to the specified response by monitoring the combined output signal.

10. The satellite of claim 1, wherein the first main amplifier stage and the first auxiliary amplifier stage are amplifiers of differing classes.

11. The satellite of claim 1, wherein the main arm, the auxiliary arm, the input splitter, the combining circuit, first bias control circuit, second bias control circuit and control circuit are formed on a common integrated circuit.

12. The satellite of claim 1, wherein the input splitter comprises:
a quadrature generator connected to the input port and configured receive the input signal, generate form the input signal a first quadrature signal and a second quadrature signal, and to provide the input signal to the main arm and the auxiliary arm respectively as the first quadrature signal and second quadrature signal.

13. The satellite of claim 1, wherein the satellite is a communications satellite.

* * * * *

UNITED STATES PATENT AND TRADEMARK OFFICE
CERTIFICATE OF CORRECTION

PATENT NO. : 11,196,480 B2
APPLICATION NO. : 16/683520
DATED : December 7, 2021
INVENTOR(S) : Tabatabaei et al.

Page 1 of 1

It is certified that error appears in the above-identified patent and that said Letters Patent is hereby corrected as shown below:

In the Claims

Column 16, Line 62 (Claim 1, Line 50): After "of" and before "signals" delete "controls" and insert -- control --.

Column 17, Lines 16-17 (Claim 3, Lines 4-5): After "configured" and before "generate" insert -- to --.

Column 18, Line 34 (Claim 12, Line 4): After "configured" and before "receive" insert -- to --.

Column 18, Line 34 (Claim 12, Line 4): After "generate" and before "the" delete "form" and insert -- from --.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*